(12) United States Patent
Champliaud et al.

(10) Patent No.: US 10,112,838 B2
(45) Date of Patent: Oct. 30, 2018

(54) METHOD AND DEVICE FOR TREATING THE FREE SURFACE OF A MATERIAL

(71) Applicant: COMMISSARIAT A L'ENERGIE ATOMIQUE ET AUX ENERGIES ALTERNATIVES, Paris (FR)

(72) Inventors: Jonathan Champliaud, Lent (FR); Mickaël Albaric, La Motte-Servolex (FR); Loic Patatut, Le Bourget du Lac (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 221 days.

(21) Appl. No.: 14/914,110

(22) PCT Filed: Jul. 28, 2014

(86) PCT No.: PCT/EP2014/066173
§ 371 (c)(1),
(2) Date: Feb. 24, 2016

(87) PCT Pub. No.: WO2015/028225
PCT Pub. Date: Mar. 5, 2015

(65) Prior Publication Data
US 2016/0200584 A1  Jul. 14, 2016

(30) Foreign Application Priority Data

Sep. 2, 2013 (FR) ...................................... 13 58366

(51) Int. Cl.
*C03B 5/00* (2006.01)
*C01B 33/023* (2006.01)
(Continued)

(52) U.S. Cl.
CPC .......... *C01B 33/023* (2013.01); *C30B 11/003* (2013.01); *C30B 29/06* (2013.01)

(58) Field of Classification Search
None
See application file for complete search history.

(56) References Cited

U.S. PATENT DOCUMENTS 6,383,285 B1    5/2002  Wakita et al.
2002/0139297 A1  10/2002  Wakita et al.
(Continued)

FOREIGN PATENT DOCUMENTS

CN    101313086 A    11/2008
CN    201971920 U     9/2011
(Continued)

OTHER PUBLICATIONS

International Search Report and Written Opinion dated Aug. 21, 2014 issued in corresponding application No. PCT/EP2014/066173; w/ English partial translation and partial machine translation (25 pages).

(Continued)

*Primary Examiner* — Cynthia Szewczyk
(74) *Attorney, Agent, or Firm* — Westeman, Hatton, Daniels & Adrian, LLP (57) ABSTRACT

The invention relates to a method comprising a step of emitting at least one first gas flow (12), a step of sweeping the free surface of the material (15) by means of said first flow (12), followed by a step of discharging the first flow via at least one discharge area. Along with the step of emitting the first flow (12), a step of emitting at least one second gas flow (13) is implemented, said second gas flow forming a protective cover over the free surface of the material (15), at a distance from said free surface. The second gas flow (13) is discharged via an upper part of the discharge area of the (Continued)

container (10), while the first flow (12) is discharged through a lower part of the discharge area.

25 Claims, 6 Drawing Sheets

(51) Int. Cl.
*C30B 11/00* (2006.01)
*C30B 29/06* (2006.01)

(56) References Cited

U.S. PATENT DOCUMENTS

| 2003/0177977 | A1 | 9/2003 | Strauch et al. |
| 2010/0003405 | A1 | 1/2010 | Kappeler |
| 2012/0137976 | A1 | 6/2012 | Chen et al. |

FOREIGN PATENT DOCUMENTS

| CN | 202688502 U | 1/2013 |
| DE | 100 64 941 A1 | 4/2002 |
| DE | 10 2013 203 113 A1 | 8/2013 |
| EP | 1 048 758 A1 | 11/2000 |
| GB | 2490130 A | 10/2012 |
| JP | 2004-510324 A | 4/2004 |
| KR | 1020120077969 A | 7/2012 |

OTHER PUBLICATIONS

European Office Action dated Nov. 7, 2017 in counterpart European application No. EP14744122.4 (with English machine translation; 16 pages).

Chinese Office Action and search report dated Oct. 17, 2107 in counterpart Chinese application No. CN201480055854.8 (English machine translation; 14 pages).

METHOD AND DEVICE FOR TREATING THE FREE SURFACE OF A MATERIAL

The invention relates to the treatment of the free surface of a material advantageously contained in a container, for example in the context of an application to the crystallization of a material such as silicon.

In electronics and in microelectronics, to fabricate "wafers", an ingot, generally of polycrystalline silicon, is cut into slices. This ingot is fabricated by a growth process performed for example by the directional solidification system DSS method. According to this DSS method, solid charges of silicon are placed in a mold, or crucible, in parallelepipedal form, and made to melt at a controlled temperature in an oven. When molten, the solidification starts in the bottom of the mold then moves upward. The fabrication of the ingot has to be performed under a gas flow of argon, or of another gas that is neutral with respect to the liquid bath such as, for example, helium or neon. Usually, the level of purity of the gas used is greater than 5N. This gas flow sweeps the free surface of the liquid silicon bath and has two functions. On the one hand, it facilitates the evaporation of oxygen and silicon oxide vapors, present on the surface of the molten silicon bath. Also, it protects the silicon bath from the outside atmosphere.

Figure 1:
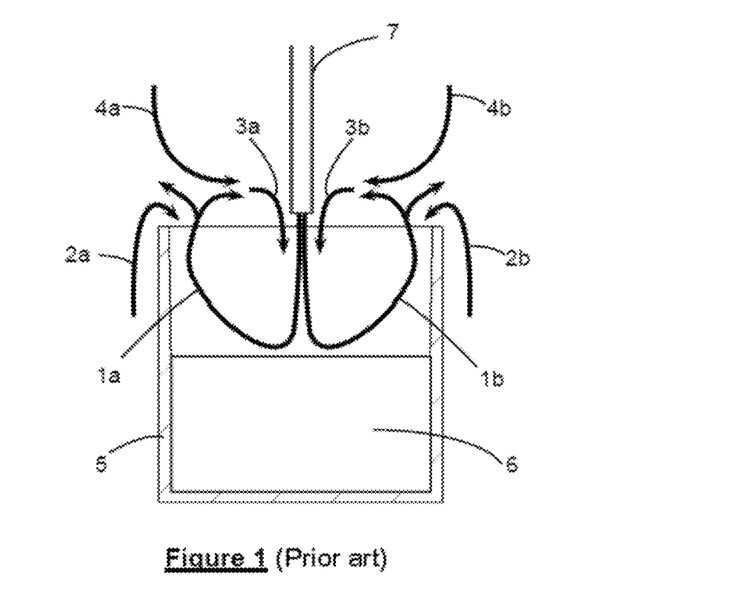
FIG. 1 represents a general view of different types of gas flows for treating the free surface of a liquid material, according to the prior art.

Referring to FIG. 1, the gas flow is produced using a blowpipe 7, placed vertically above the silicon bath 6 and whose bottom end piece is positioned centrally and at some fifteen or so centimeters above the surface of the bath 6. In operation, the blowpipe 7 expels, through its bottom end piece, a flow of argon directed downward and toward the center of the surface of the bath 6. The flow created by this blowing mode generates recirculation loops 1A and 1B which hamper the effectiveness of the desired protection for a number of reasons. On the one hand, these loops 1A, 1B have the effect of sucking outside atmosphere (as represented by the arrows 2A and 2B) from the sides toward the interior of the mold. Also, a portion of the rising flow of argon having already licked the surface of the bath a first time and thereby containing impurities, is reinjected downward and licks the surface of the bath a second time (as represented by the arrows 3A and 3B). Finally, the portion of the rising flow of argon which is reinjected downward constitutes a vector for conveying impurities present in the environment of the bath 6, deriving for example from the walls of the oven. Finally, the circulation of the gas flow sweeping the free surface of the material to be treated is poorly controlled.

The present invention improves the situation. To this end, the invention relates to a method for treating a free surface of a material comprising a step of emission of at least one first gas flow, a step of sweeping of the free surface of the material by the first flow followed by a step of discharging of the first flow through at least one discharge zone, characterized in that it comprises, concomitantly with the step of emission of the first flow, a step of emission of at least one second gas flow forming a protective cover over the free surface of the material, at a distance from said free surface, and a step of discharging of the second gas flow through an upper part of said discharge zone of the container, said first flow being discharged through a lower part of the discharge zone.

By virtue of the invention, the second flow being discharged through the upper part of the discharge zone creates a suction which guarantees a good discharging of the first flow and avoids, for example, the formation of recirculation loops. The second flow acts not only to protect the material from the environment around the container but also to assist in direct discharging of the first flow rising up after a first and single sweep of the free surface of the material.

The first gas flow can serve to purify the free surface of the material. It is also possible to envisage having this first flow serve a purpose other than purification. For example, it could for example be a gas, or a gas mixture, that reacts with the liquid material to be treated.

In a particular embodiment, the material being contained in a container provided with at least one discharge opening, the second flow is discharged through an upper part of said discharge opening and the first flow is discharged through a remaining lower part of the discharge opening.

In a particular embodiment, a number N of second gas flows is emitted then discharged respectively through N discharge openings of the container, N being greater than or equal to two, notably equal to four.

In this case, the second flows are diffused so as to cover the different discharge openings of the container.

Advantageously, a set of first flows is emitted, said set comprising a central flow directed vertically downward and a plurality of lateral flows oriented respectively toward a plurality of peripheral zones of the free surface of the material. By virtue of this, the free surface of the liquid material is better covered by the first flows.

In a particular embodiment, the second flow is dimensioned to cover the horizontal width of said discharge opening. By virtue of this, the suction created by the second flow is optimal.

Advantageously, the first central flow is emitted from an emission zone positioned below the discharge opening.

By virtue of this, the first flow does not risk being discharged toward the outside of the container after having swept the free surface of the material.

Also advantageously, the first and second flows are emitted from emission zones situated on or in proximity to a vertical central axis of the container.

Thus, the flows are diffused optimally and uniformly in the container.

According to particular embodiments:
- said upper part of the discharge opening occupies up to 80% of the overall height of the opening, notably between 50% and 70% of said height;
- the first lateral flows are directed in a direction forming an angle lying strictly between 0° and 90° relative to the vertical, notably less than or equal to 45°;
- the first flow is a flow for purifying the free surface of the material, comprising a gas, or a gas mixture, that is inert with respect to the material to be treated;
- the step of sweeping of the free surface of the material is implemented during an operation of crystallization of the material.

The invention relates also to a device for treating a free surface of a material, comprising hardware elements suitable for implementing the steps of the method defined previously.

The invention relates also to a device for treating a free surface of a material, comprising a duct for emitting at least one first gas flow suitable for sweeping the free surface of the material then being discharged through at least one discharge zone, characterized in that the emission duct comprises at least one lateral emission opening for a second gas flow suitable for forming a protective cover over the free surface of the material and at a distance from said free surface, and for being discharged through an upper part of the discharge zone of the container, a lower part of the discharge zone serving to discharge the first flow.

Advantageously, the device comprises N lateral openings for emitting N respective second gas flows, N being greater than or equal to two, notably equal to four.

Also advantageously, the duct comprises two parts, upper and lower, the section of the upper part being greater than that of the lower part, and said lateral emission opening being formed in the upper part.

In a particular embodiment, the lower part comprises an upper collar introduced into the upper part, said collar having at least one ramp for the flow of a second flow extending at least partially in line with the lateral emission opening, said ramp being formed to orient the second flow toward the upper part of the discharge zone of the container.

Advantageously, the collar forms a plurality of vertical slots, each slot comprising a bottom that is inclined relative to the vertical and forming a ramp for the flow of a first lateral flow, said ramp being adapted to orient the first flow toward a plurality of zones of one or more lateral walls of the container.

In a particular embodiment, said lateral emission opening for a second flow is dimensioned so as to ensure a division of a gas feed flow into at least one second flow and at least one first flow according to predefined proportions.

The invention relates also to a system comprising a device as has just been defined and a container intended to contain the material to be treated.

Advantageously, said container has no cover.

The second flow or flows form a layer of gas at a distance from the free surface of the material and extending over the latter by covering it. This layer of gas ultimately constitutes a protective gas cover. The physical cover of the container can thus be eliminated. The elimination of the physical cover makes it possible, on the one hand, to more easily fill the container with solid charges of material and, on the other hand, to obtain a space saving to charge the container with charges of solid material in pieces, before the latter are melted.

The invention will be better understood from the following description of a particular embodiment of the method for treating the free surface of a material and a particular exemplary embodiment of an associated treatment device, in the context of a particular application of the invention to the crystallization of a material, with reference to the attached drawings in which.

Figure 2:
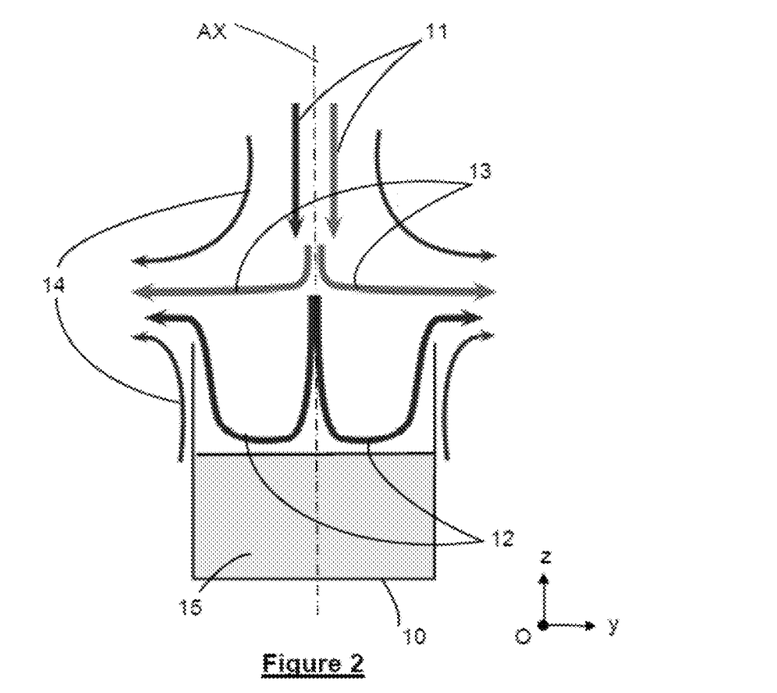
FIG. 2 represents a general view of different types of gas flows for treating the free surface of a liquid material.
Figure 3:
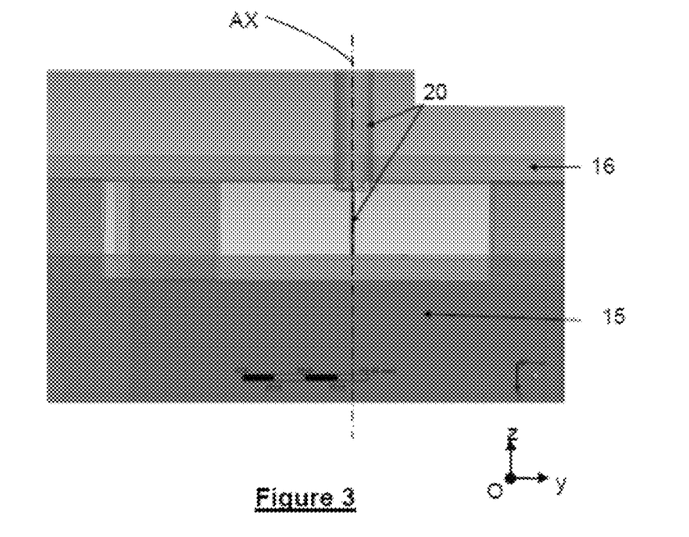
FIG. 3 represents a schematic view of a treatment device mounted in a container, above the free surface of a liquid material contained in the container, according to a particular exemplary embodiment, the device represented being adapted to produce the flows of FIG. 2.

FIG. 2 schematically shows a container 10 containing a liquid material 15, this container being placed in the enclosure of an oven. The arrows 11-14 shown in this figure correspond to gas flows and make it possible to illustrate the principle of the invention. The gas flows 12, 13, from one or more feed flows 11, cooperate to treat the free surface of the liquid material 15, as will be explained in more detail later. The flows 14 correspond to gas flows around the container 10, in the enclosure of the oven.

By definition, a "gas flow" describes the flow of a gas formed by the gas emitted through an opening. A duct, or a duct end piece, having N emission openings is therefore suitable for emitting N gas flows, formed respectively by the N openings.

In the example of the description, the treatment according to the invention is described in the case of a particular application to the crystallization of silicon. The material 15 is liquid silicon, molten, and the container 10 is a crucible intended for the fabrication of a silicon ingot.

A three-dimensional and orthogonal reference frame (x, y, z) is represented in the different figures, the axes x, y corresponding to a horizontal plane and the axis z corresponding to the vertical.

Figure 4A:
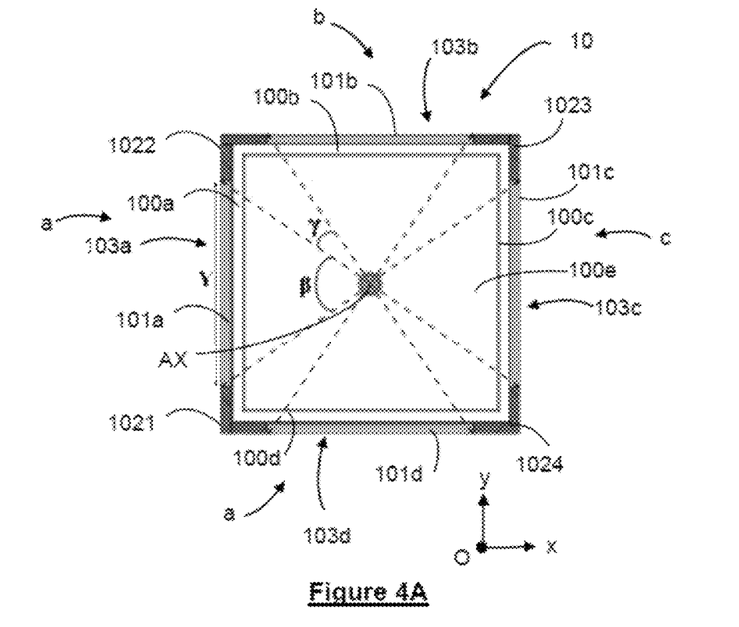
FIGS. 4A and 4B respectively represent a plan view of the horizontal covering of a protective flow produced by the device of FIG. 3 and a lateral view of the vertical covering of this protective flow.

FIG. 4A represents a plan view of the crucible 10 according to a particular exemplary embodiment. The crucible 10 has a parallelepipedal form of square section and of central longitudinal axis AX, the axis being vertical. The crucible 10 is open at the top to allow it to be fed with solid charges of silicon. It comprises internal lateral walls 100a-100d and a bottom 100e, produced in silica.

Since silica becomes soft at high temperatures (typically greater than temperatures of the order of 1200° C.), counter-crucible parts made of dense graphite at least partially surround the lateral walls 100a-100d. The counter-crucible comprises outer lateral elements 101a-101d reinforcing the mechanical strength of the crucible 10, and four raised corners 1021-1024 rising higher than the lateral walls 100a-100d of silica. The overall height of the crucible 10 is for example of the order of 40 cm. The liquid silicon contained in the crucible generally reaches a height of approximately 20 to 30 cm. The free surface of the silicon therefore extends 10 to 20 cm lower than the height of the walls 100a-100d of the crucible 10.

Figure 4B:
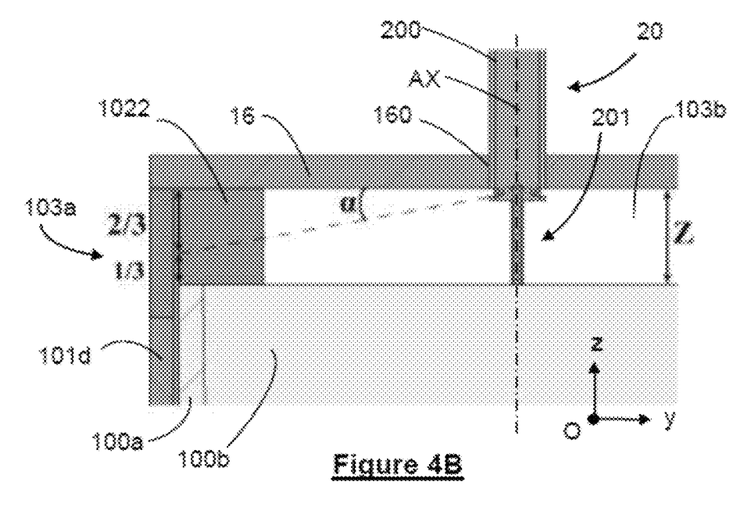

A cover 16 rests on the raised corners 1021-1024. Four lateral discharge openings 103a-103d are thus formed between the cover 16, the reinforced lateral walls 100a-100d and the raised corners 1021-1024. Each discharge opening 103a (103b-103d) is thus delimited at the bottom by the top edge of a reinforced lateral wall of silicon 100a (100b-100d), laterally by two neighboring raised corners 1021-1022 (1022-1023, 1023-1024, 1024-1021) and at the top by the cover 16. Each discharge opening has a horizontal width Y (FIG. 4A) and a height Z (FIG. 4B). The value of Z can be of the order of a few centimeters, for example 6 cm, and the value of Y can be of the order of one or more tens of centimeters, for example approximately 30 cm.

As a variant, the container 10 could have a different form, for example cylindrical, and form a number N of lateral discharge openings other than four, N being greater than or equal to one.

During the crystallization of the silicon in the crucible 10, placed in an oven, for the fabrication of a silicon ingot, the free surface of the molten liquid silicon is treated by gas flows, for example argon. However, it would be possible to envisage the use of another suitable vector gas and in particular a gas or a mixture of gases that are inert with respect to the liquid material to be treated, such as helium or neon for example. The aim of the treatment is, on the one hand, to evaporate the vapors of oxygen and the silicon oxide gas present on the surface of the molten silicon and, on the other hand, to protect the free surface of the liquid silicon from the "outside" environment of the crucible 10, that is to say from the atmosphere inside the oven.

Figure 9:
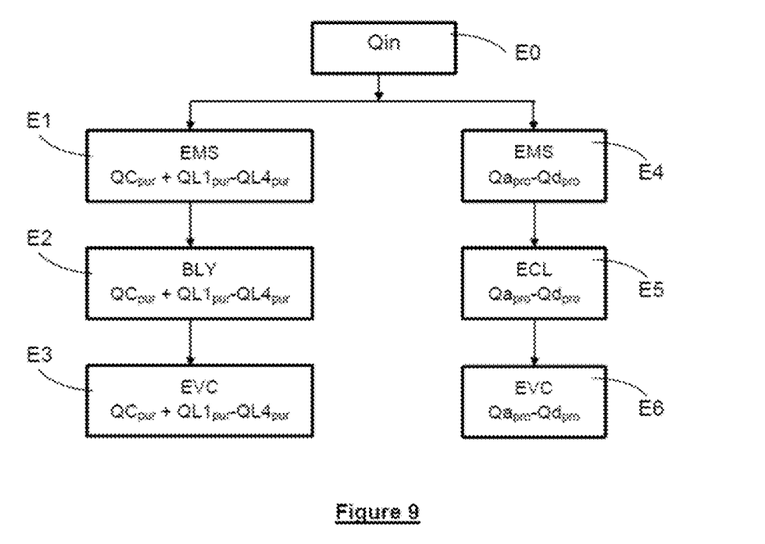
FIG. 9 represents a flow diagram of the steps of the treatment method, according to a particular embodiment of the invention.

Referring to FIG. 9, the method for treating the free surface of the liquid silicon contained in the crucible 10 will now be described.

FIG. 2 schematically shows the phenomena of flow of gas flows in and around the crucible 10 that occur during a treatment of the free surface of the liquid silicon 15. Thus, there are represented:
- flows 12 corresponding to purification flows $QC_{pur}$ and $QL1_{pur}$-$QL4_{pur}$,
- flows 13 corresponding to protective flows $Qa_{pro}$-$Qd_{pro}$ and
- flows 14 corresponding to gases circulating around the crucible 10, in the enclosure of the oven.

The treatment method comprises a step E0 of feeding gas, here argon, consisting in feeding the crucible 10 with a flow of argon from a tank, not represented. In the particular example described here, the step E0 consists in bringing a feed flow of argon, denoted Qin, to a device for emitting and distributing gas flows in the crucible 10. This feed step is implemented continuously throughout the treatment of the free surface of the silicon, during the fabrication of an ingot. It would be possible to envisage feeding the container with a number of flows of argon.

The method then comprises a step E1 of emission, here, of a plurality of purification gas flows. The purification flows emitted comprise:
- a vertical central flow directed downward, denoted $QC_{pur}$, and
- here, four oblique lateral flows, denoted $QL1_{pur}$-$QL4_{pur}$, directed overall downward and oriented obliquely toward four target zones of the free surface of silicon, these target zones being respectively situated in proximity to the four internal corners of the crucible 10.

The purification flows are emitted from central emission zones situated on the axis AX or in proximity thereto (at a distance from the axis AX of between 0 and one, even a few centimeters), above the silicon bath 15.

The direction of the oblique lateral flows $QL1_{pur}$-$QL4_{pur}$ forms an angle θ (represented in FIG. 8) of inclination relative to the vertical. Here, this angle θ lies strictly between 0° and 90°, preferably strictly greater than 0° and less than or equal to 45°.

The zone of emission of the central flow $QC_{pur}$ is offset downward relative to the zones of emission of the lateral flows $QL1_{pur}$-$QL4_{pur}$. In the case in point, the zone of emission of the central flow $QC_{pur}$ is situated slightly below the upper opening plane of the silica mold formed by the walls 100a-100d (or by the walls 101a-101d in the case where the walls of the graphite counter-crucible are higher than the silica crucible), whereas the zones of emission of the lateral flows $QL1_{pur}$-$QL4_{pur}$ are situated slightly under the cover 16.

The method then comprises a sweeping step E2 during which the purification flows emitted come to lick, or sweep, the free surface of the liquid silicon 15. The association of the different types of purification flows, namely the central flow $QC_{pur}$ and the lateral flows $QL1_{pur}$-$QL4_{pur}$, ensures that all of the free surface of liquid silicon 15 is swept. This sweeping step is implemented during the crystallization of the silicon 15.

After having swept the free surface of the silicon, the purification flows rise up again along the lateral walls of the crucible 10 and are discharged through the discharge openings 103a-103d, in a step E3.

The method also comprises a step E4 of emission of at least one protective argon flow. In the particular example described in the case in point, four protective flows $Qa_{pro}$-$Qd_{pro}$ are emitted from emission zones situated in proximity to the central axis AX, slightly under the cover 16. This emission step E4 is executed concomitantly with the step E1 of emission of the purification flows. Thus, the purification flows $QC_{pur}$ and $QL1_{pur}$-$QL4_{pur}$ and the protective flows $Qa_{pro}$-$Qd_{pro}$ are emitted at the same time.

In a subsequent step E5, the protective gas flows $Qa_{pro}$-$Qd_{pro}$ emitted flow over the liquid silicon so as to form a layer of gas spreading over the silicon 15 and spaced apart from the free surface thereof by a non-zero distance interval. This layer of gas forms a protective barrier and ultimately constitutes a gas cover, positioned over the purification flows $QC_{pur}$ and $QL1_{pur}$-$QL4_{pur}$. Thus, the purification flows are inserted (at least partly) between the protective flows $Qa_{pro}$-$Qd_{pro}$ and the free surface of the silicon bath 15.

Then, in a step E6, the four protective flows $Qa_{pro}$-$Qd_{pro}$ are discharged toward the outside of the crucible 10. Each protective flow $Qa_{pro}$ ($Qb_{pro}$-$Qd_{pro}$) is discharged through an upper part of the corresponding discharge opening 103a (103b-103d) of the container 10.

FIG. 4A shows the horizontal cover (that is to say in a horizontal plane) of the protective flows $Qa_{pro}$-$Qd_{pro}$. Take the example of the flow $Qa_{pro}$. This flow $Qa_{pro}$ is diffused from an emission zone situated in proximity to the axis AX toward the opening 103a, the width of the flow $Qa_{pro}$ parallel to the side a of the crucible 10 increasing toward the opening 103a. The width of the flow $Qa_{pro}$, when it reaches the opening 103a, is equal or substantially equal to the width Y of the opening 103a. Thus, horizontally, the flow $Qa_{pro}$ covers all of the width Y of the opening 103a. The opening angle β of the flow $Qa_{pro}$ here lies between 60° and 90°, depending on the size of the crucible 10. The horizontal cover of the other flows $Qb_{pro}$-$Qd_{pro}$ respectively associated with the openings 103b-103d, is similar to that of the flow $Qa_{pro}$. In FIG. 4A, the angle γ represents the angle of corner parts of the crucible not covered by the protective flows. This angle γ varies between approximately 0 and 30°. The sum of the angles β and γ is here equal to 90°.

FIG. 4B shows the vertical cover (along z) of the protective flow $Qa_{pro}$. In the particular example represented in this figure, the protective flow $Qa_{pro}$ is diffused from an emission zone situated in proximity to the axis AX, slightly below the cover 16. It flows toward the opening 103a, below and along the cover 16, widening downward (along z) by an angle α, then is discharged from the crucible 10 through an upper part of the opening 103a. This upper part corresponds for example to ⅔ of the overall height of the discharge opening 103a. As a variant, the upper part of the discharge opening 103a covered by the protective flow $Qa_{pro}$ could occupy up to 80% of the overall height of this opening 103a, preferentially between 50% and 70%. The angle a is defined by the horizontal plane on which the cover 16 extends and the lower limit plane of the flow $Qa_{pro}$.

The value of this angle a depends on the size of the crucible 10 and on the height of the discharge opening 103a. It is typically non-zero and less than or equal to 25° for usual crucible and discharge opening dimensions. The vertical cover of the other flows $Qb_{pro}$-$Qd_{pro}$, respectively associated with the openings 103b-103d, is similar to that of the flow $Qa_{pro}$.

Note that the vertical central purification flow $QC_{pur}$ is emitted from an emission zone situated below the plane containing the bottom edges of the discharge openings 103a-103d of the crucible, in order to avoid a discharging of the flow before the free surface of the silicon bath is swept. The role of the purification flows $QC_{pur}$ and $QL1_{pur}$-$QL4_{pur}$ is to purify the interior of the crucible 10, and notably the free surface of the silicon by sweeping the latter. They come to lick—or sweep—the free surface of the silicon bath then rise laterally, along the internal lateral walls of the crucible 10, and finally are discharged out of the crucible 10 through the discharge openings 103a-103d. The circulation of these purification flows $QC_{pur}$ and $QL1_{pur}$-$QL4_{pur}$ is schematically represented in FIG. 2 by the reference 12. They clean the free surface of the liquid silicon 15, by acting on a layer extending over the silicon bath. They also promote the evaporation of oxygen and of silicon oxide gas, which has the effect of reducing the quantity of oxygen in the fabricated ingot.

The role of the protective flows $Qa_{pro}$-$Qd_{pro}$ is to form a protective barrier for the free surface of the silicon bath protecting against the gases and impurities circulating in the enclosure of the oven. They prevent these gases and impurities, present in the environment around the crucible, from reaching the free surface of the liquid silicon and from polluting the ingot.

Furthermore, the protective flows $Qa_{pro}$-$Qd_{pro}$, by being discharged out of the crucible 10 through the upper part of the discharge openings 103a-103d, cooperate with the purification flows $QC_{pur}$ and $QL1_{pur}$-$QL4_{pur}$ to:

contribute to the outward discharging, through the remaining lower part of the discharge openings 103a-103d, of the purification flows $QC_{pur}$ and $QL1_{pur}$-$QL4_{pur}$ which rise after having swept the free surface of silicon 103a-103d a first and single time, and prevent the formation of recirculation loops.

This synergy between the two types of flow (protective and purification) is explained by the fact that the protective flows $Qa_{pro}$-$Qd_{pro}$, by being discharged through the upper part of the discharge openings 103a-103d, create, by venturi effect, a suction phenomenon, that can also be qualified as pump effect, by attracting outward from the crucible 10 the rising purification flows $QC_{pur}$ and $QL1_{pur}$-$QL4_{pur}$. In other words, the protective flows $Qa_{pro}$-$Qd_{pro}$ produce a suction (or pump) which helps and forces all of the rising protective flows to be discharged directly out of the crucible 10, without any part of these flows going back into the crucible 10.

The treatment method according to the invention makes it possible to effectively purify the free surface of the silicon bath and notably avoid any carbon or oxygen pollution of the silicon. The fabricated silicon ingot is thus free of contamination of this type.

There now follows a description of a particular exemplary embodiment, nonlimiting, of a treatment device 20 suitable for implementing the method which has just been described.

Note that the method could be implemented by other embodiments of the treatment device comprising hardware elements suitable for implementing the steps of the method which has just been described.

The treatment device is adapted to divide up an incoming flow of argon, Qin, into different purification $QC_{pur}$ and $QL1_{pur}$-$QL4_{pur}$ and protective $Qa_{pro}$-$Qd_{pro}$ flows and to diffuse these flows in order to treat the free surface of the liquid silicon 15 contained in the crucible 10 when fabricating a silicon ingot.

The device comprises a gas flow emission duct 20 extending along the vertical axis AX which forms an axis of symmetry of the duct 20. The emission duct here comprises an upper part 200 and a lower part 201, connected to one another. Hereinbelow, "upper duct" will be used to refer to the upper part 200 of the emission duct 20, and "lower duct" will be used to refer to the lower part 201 of the emission duct 20.

As a variant, the duct could be manufactured in a single piece.

Figure 5:
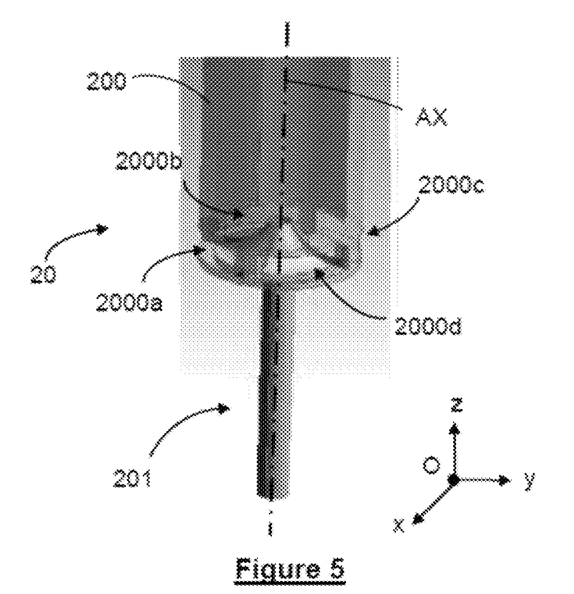
FIG. 5 represents a partially transparent 3D view of the treatment device of FIG. 3.

The upper duct 200, of cylindrical form, is linked by a feed duct (not represented) to an argon feed tank (not represented). The lower end portion of the duct 200 is open downward through an opening for connection to the lower duct 201 and here forms four lateral emission openings 2000a-2000d as represented in FIG. 5.

The lateral emission openings 2000a-2000d consist of straight-edged slots that are horizontally elongated. They are all of the same dimensions and are distributed regularly over the perimeter of the duct 200. Each opening 2000a-2000d extends, in a horizontal plane, along a circular arc defined by an angle δ (not represented). This angle δ is formed by the two half-lines starting from the axis AX and passing through the lateral ends of the opening in a horizontal plane. It is equal to the angle β mentioned previously and is therefore between 60° and 90°. The height of the openings 2000a-2000d, denoted Z2, here lies between 0 and 5 cm. The function of these lateral openings 2000a-2000d is to emit the four protective flows $Qa_{pro}$-$Qd_{pro}$, respectively, as will be explained later.

The lower duct 201 comprises a bottom end fitting 2016, forming a blowpipe, topped by an upper collar 2012. The assembly is passed through by an internal central channel 2013 for the passage of a gas, of cylindrical form and of longitudinal axis AX. This channel 2013 links a top gas inlet opening 2010 and a bottom gas emission outlet opening 2011. In operation, the inlet opening 2010 takes a portion of the gas flow feeding the device 20 in order to produce the central purification flow $QC_{pur}$ which is emitted downward through the bottom outlet opening 2011. The channel 2013 is narrower than the interior of the upper duct 200. For example, the radius of the curvature of the lower channel 2013 and the internal radius of the upper duct 200 can lie respectively between 2 mm and 10 mm and between 10 mm and 30 mm.

Figures 7A, 7B:
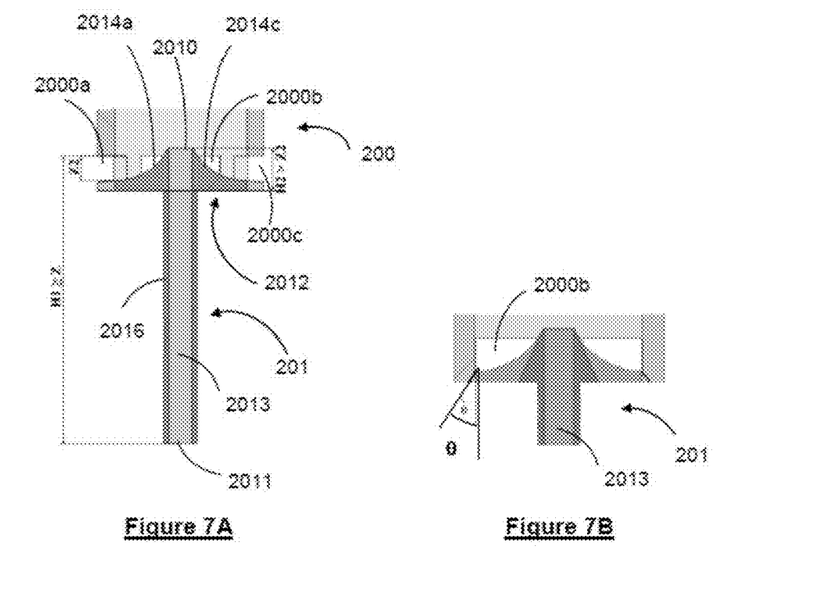
FIGS. 7A and 7B represent two cross-sectional views, offset by 90°, of the bottom of an upper part and of the top of the lower part of the duct of the treatment device.

The collar 2012 has a profile which flares from the inlet opening 2010 downward, the underside of the collar 2012 extending in a horizontal plane. The height H2 of the collar 2012 is strictly greater than the height Z2 of the emission openings 2000a-2000d and is adapted in such a way that the inlet opening 2010 is situated above the emission openings 2000a-2000d of the upper duct 200, as represented in FIG. 7A.

The top of the collar 2012 here comprises four ramps 2014a-2014d for the flow and guidance of the protective flows $Qa_{pro}$-$Qd_{pro}$, of the same forms and of the same dimensions. The upper surfaces of these ramps are here curved, in "toboggan" form, and directed downward. The inclination of the bottom of the ramp is equal to the angle α, which determines the vertical coverage of the protective flows $Qa_{pro}$-$Qd_{pro}$. The radial extent of each ramp 2014a-

2014d is defined by the angle corresponding to the angle of the lateral emission openings 2000a-2000d of the upper duct 20 (this angle being equal to the angle β of radial coverage of a protective flow). The ramps 2014a-2014d are thus formed to orient the protective gas flows toward the upper part of the discharge openings 103a-103d of the crucible 10.

Figure 6A:
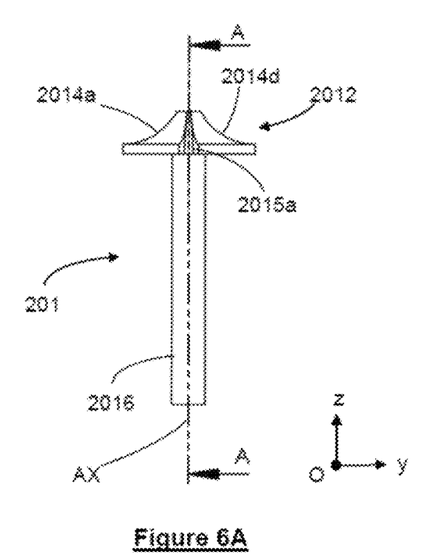
FIGS. 6A, 6B and 6C respectively represent a side view, a view in cross section AA and a bottom view of a lower part of a duct of the treatment device.
Figures 6B, 6C:
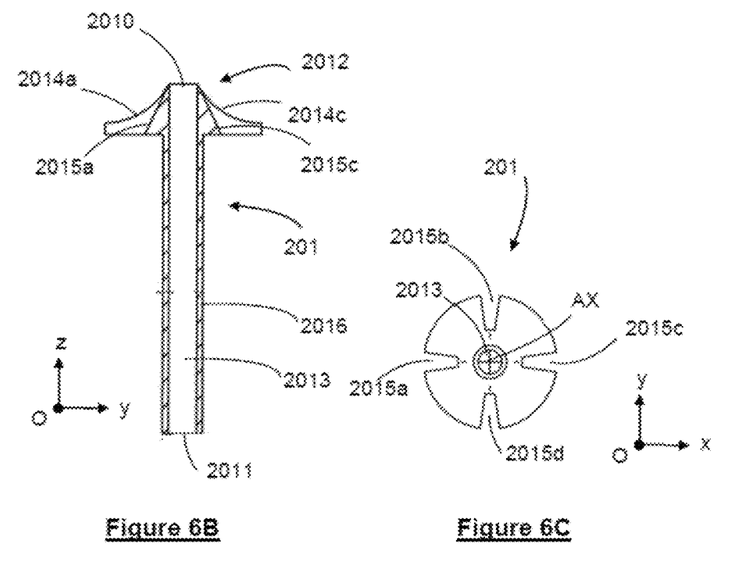

Referring to FIGS. 6A to 6C, the four ramps 2014a-2014d are separated from one another by vertical radial slots 2015a-2015d, formed in the collar 2012. The opening angle of each slot is the angle γ (FIG. 4A). It would also be possible to envisage vertical openings 2015a-2015d in the form of notches of constant width, the angle being zero in this case. The bottom of each slot 2015a-2015d extends in a plane inclined according to the angle θ relative to the vertical and constitutes a flow ramp for a lateral purification flow. The inclination of the bottom of the slot makes it possible to orient the argon flow in the direction θ, here the corner zones of the crucible 10, as previously explained. These slots 2015a-2015d thus constitute channels for the expulsion of the lateral purification flows $QL1_{pur}$-$QL4^{pur}$.

Referring to FIG. 7A, the height H1 as represented in FIG. 7A, between the bottom opening 2011 of the duct 201 and the plane containing the top edges of the emission openings 2000a-2000d, is greater than or equal to the height Z of the discharge openings 103a-103d of the crucible 10. Thus, the vertical purification flow is emitted from an emission zone positioned below the discharge openings 103a-103d of the crucible 10.

The lower duct 21 is connected to the upper duct 20 by introduction of the collar 2012 into the lower end portion of the upper duct 20, the underside of the collar 2012 extending in the plane of the bottom opening of the upper duct 20.

The two ducts 200, 201 can be fixed together by screwing, threading being in this case produced in the bottom of the collar 2012 and on the internal wall of the upper duct 20. A centering element, for example a nut, is also provided to ensure a relative positioning of the two ducts 200 and 201. This positioning should ensure that the four emission openings 2000a-2000d of the upper duct 200 are placed in line (at least partially) with the four ramps 2014a-2014d respectively and that the bottom edges of the openings 2000a-2000d extend in the extension of the bottom of the ramps 2014a-2014d.

The treatment device is mounted on the cover 16, by introduction through an opening 160 formed in the cover 16. It is positioned in such a way that the lateral emission openings 2000a-2000d, formed in the bottom end portion of the upper duct 20, are situated below the cover 16, for example at a distance of between 0 and 1 cm below the cover 16.

The assembly comprising the lateral emission openings 2000a-2000d of the upper duct 200, the collar 2012 and the blowpipe 2016 form a distributor arranged and formed to divide up an incoming flow of argon Qin into different flows, namely the purification flows, central $QC_{pur}$ and lateral $QL1_{pur}$-$QL4_{pur}$, and the protective flows $Qa_{pro}$-$Qd_{pro}$, according to predefined respective proportions.

The dimensions of the lateral emission openings 2000a-2000d are notably adapted to ensure a distribution of the incoming flow of argon Qin between the different types of flow, namely the vertical purification flow, the lateral purification flows and the protective flows, according to predefined proportions.

Take the example of a treatment device having the following (approximate) dimensions:
Y≅31 cm;
Z≅6 cm;
Z2≅0.5 cm;
α≅6.5°;
β≅73°;
γ≅17°;
θ≅12°.

Furthermore, the crucible 10 is of standard "G2" size, of square section, and has the following dimensions:
height: 420 mm
width of each side: 380 mm.

Figure 8:
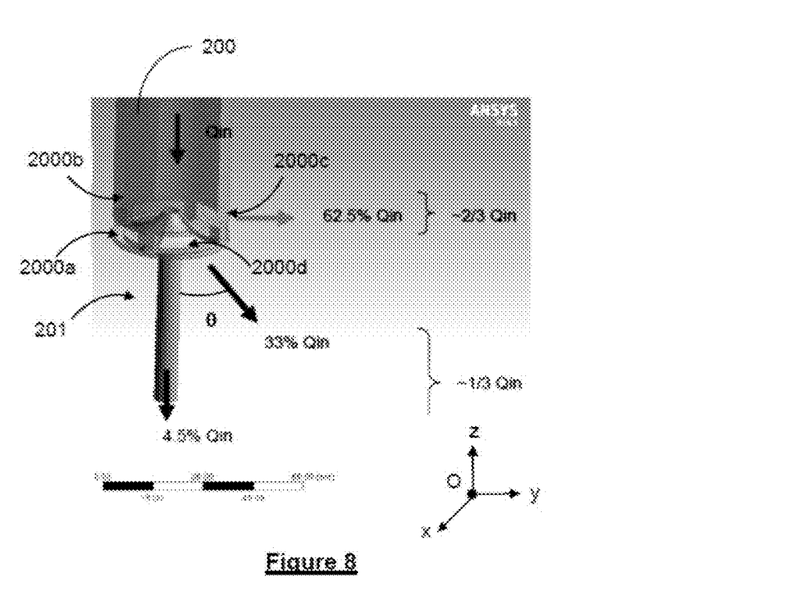
FIG. 8 represents a partially transparent 3D view of the treatment device of FIG. 3 and shows the distribution of different types of gas flows emitted.

Referring to FIG. 8, with such dimensions, the flow of argon feeding the device, denoted Qin, is divided up globally as follows:
the protective flows $Qa_{pro}$-$Qd_{pro}$ represent approximately 62.5% of the flow Qin;
the lateral purification flows $QL1_{pur}$-$QL4_{pur}$ represent approximately 33% of the flow Qin;
the purification flow $QC_{pur}$ represents approximately 4.5% of the flow Qin.

In other words, the flow of argon Qin is globally divided up as follows: ⅔ horizontal or slightly inclined relative to the horizontal ($Qa_{pro}$-$Qd_{pro}$) and ⅓ directed downward ($QL1_{pur}$-$QL4_{pur}$ and $QC_{pur}$). Such a distribution is optimal.

In the particular exemplary embodiment which has just been described, the flows $QC_{pur}$ and $QL1_{pur}$-$QL4_{pur}$, called "first flows", have a function of purification of the free surface of the material to be treated. The treatment applied by these first flows consists in purifying the free surface of the material. To this end, the gas (or the gas mixture) that makes up the first flows $QC_{pur}$ and $QL1_{pur}$-$QL4_{pur}$ is inert with respect to the material to be treated. These first flows could, as a variant, have a treatment function for the free surface of the material, other than purification. They could be gas flows reacting with the material to be treated, the reaction between the first flows and the material corresponding to the treatment applied to the material.

Generally, the invention therefore relates to a method for treating the free surface of a liquid material in which
one or more first gas flows are emitted, sweep the free surface of the liquid material then are discharged through the discharge opening of the container containing the material to be treated, and
concomitantly with the emission of the first flow or flows, one or more of the second gas flows are emitted, so as to form, above the material to be treated, a protective cover at a distance from the free surface of the material, then are discharged through an upper part of the discharge opening of the container, the first flow or flows being discharged through the remaining lower part of the discharge opening.

In the above description, the first flows and the second flows comprise the same gas (or gas mixture). As a variant, they could be two different gases (or gas mixtures).

Instead of having a square section, the container 10 could have any other form. For example, the container 10 could be of cylindrical form and have a circular section. In this case, the first flows (namely the purification flow in the case of the application of the invention to the crystallization of a material) comprise a central flow directed vertically downward and a plurality of lateral flows oriented respectively toward a plurality of zones of one or more lateral walls of the container.

In the description which has just been given, the container 10 is closed by a cover 16. It would be possible to envisage eliminating the physical cover, the layer of gas formed by the protective flows ensuring the function of gas cover forming a protective barrier between the outside and the inside of the container. The invention therefore relates also to a system comprising the flow emission device and a container without any cover.

In the above description, the container forms discharge openings for the treatment flows. It would also be possible to envisage having the flows discharged through a discharge zone directly above the top edge of the container and extending over all of the periphery of the free surface to be treated of the material. In this case, the second treatment flow or flows (namely the protective flows in the example described) are discharged through an upper part of the discharge zone and the first treatment flow or flows (namely the purification flows in the example described) are discharged through a lower part of the discharge zone, inserted between the upper part of the discharge zone and the top edge of the container.

The material to be treated could be solid. In this case, it could be not contained in a container and the discharge zone could be directly above the periphery of the free surface of the material.

The invention claimed is:

1. A method for treating a free surface of a silicon material, comprising:
    emitting at least one first gas flow from a first opening,
    sweeping the free surface of the silicon material by the first flow, followed by
    discharging the first flow through at least one discharge opening,
    concomitantly with the emitting of the first flow, emitting at least one second gas flow from at least one second opening, the second gas flow forming a protective cover over the free surface of the material, at a distance from said free surface, and discharging the second gas flow through an upper part of the discharge opening, the first flow being discharged through a lower part of the discharge opening,
    wherein the upper part of the discharge opening occupies up to 80% of the overall height of the discharge opening.

2. The method as claimed in claim 1, wherein the material is contained in a container provided with the at least one discharge opening.

3. The method as claimed in claim 2, wherein a number N of second gas flows is emitted and then discharged respectively through N discharge openings of the container, N being greater than or equal to two.

4. The method as claimed in claim 2, wherein a set of first flows is emitted, said set comprising a central flow directed vertically downward and a plurality of lateral flows oriented respectively toward a plurality of peripheral zones of the free surface of the material.

5. The method as claimed in claim 4, wherein the first central flow is emitted from an emission zone positioned below the discharge opening.

6. The method as claimed in claim 4, wherein the first lateral flows are directed in a direction forming an angle (θ) strictly lying between 0° and 90° relative to the vertical.

7. The method as claimed in claim 2, wherein the second flow is dimensioned to cover the horizontal width of said discharge opening.

8. The method as claimed in claim 2, wherein the first and second flows are emitted from emission zones situated on or in proximity to a vertical central axis of the container.

9. The method as claimed in claim 1, wherein the first flow is a flow for purifying the free surface of the material, comprising a gas, or a gas mixture, that is inert with respect to the material to be treated.

10. The method as claimed in claim 1, wherein the sweeping of the free surface of the material is implemented during an operation of crystallization of the material.

11. A device for treating a free surface of a material, comprising hardware elements suitable for implementing the method as claimed in claim 1.

12. A system comprising a device as claimed in claim 11 and a container intended to contain the material to be treated.

13. The system as claimed in claim 12, wherein said container has no cover.

14. The method as claimed in claim 1, wherein a height between the first opening and the second opening is greater than or equal to the overall height of the discharge opening.

15. The method as claimed in claim 1, wherein the first gas flow is directed in a first direction toward the free surface of the material, and the second gas flow is directed in a second direction forming an angle strictly lying between 0° and 90° relative to the first direction.

16. The method as claimed in claim 1, wherein the at least one second opening comprises N lateral openings for emitting N respective second gas flows, N being greater than or equal to two,
    wherein a height between the first opening and each of the lateral openings is greater than or equal to the overall height of the discharge opening.

17. The method as claimed in claim 1, wherein the angle is comprised in a range of from 60° to 90°.

18. A device for treating a free surface of a material, comprising:
    an emission duct for emitting at least one first gas flow from the first opening, the first gas flow being suitable for sweeping the free surface of the material then being discharged through at least one discharge opening,
    wherein the emission duct comprises at least one second opening which is a lateral opening for emitting a second gas flow suitable for forming a protective cover over the free surface of the material and at a distance from said free surface, and for being discharged through an upper part of the discharge opening of the container, a lower part of the discharge opening serving to discharge the first flow,
    wherein the upper part of the discharge opening occupies up to 80% of the overall height of the discharge opening, and
    wherein a height between the first opening and the second opening is greater than or equal to the overall height of the discharge opening.

19. The device as claimed in claim 18, comprising N lateral openings for emitting N respective second gas flows, N being greater than or equal to two,
    wherein a height between the first opening and each of the lateral openings is greater than or equal to the overall height of the discharge opening.

20. The device as claimed in claim 18, wherein the emission duct comprises two parts, called upper part and lower part, respectively, a section of the upper part being greater than a section of the lower part, and said lateral emission opening being formed in the upper part.

21. The device as claimed in claim 20, wherein the lower part comprises an upper collar introduced into the upper part, said collar having at least one ramp for the flow of a second flow extending at least partially in line with the lateral emission opening, said ramp being formed to orient the second flow toward the upper part of the discharge zone.

22. The device as claimed in claim 21, wherein the collar forms a plurality of vertical slots, each slot comprising a bottom that is inclined relative to the vertical and forming a ramp for the flow of a first lateral flow, said ramp being adapted to orient the first lateral flow toward a plurality of peripheral zones of the free surface of the material.

23. The device as claimed in claim 18, wherein said lateral emission opening for a second flow is dimensioned so as to ensure a division of a gas feed flow into at least one second flow and at least one first flow according to predefined proportions.

24. The device as claimed in claim 18, wherein the first opening is configured so that the first gas flow is directed in a first direction toward the free surface of the material, and the at least one second opening is configured so that the second gas flow is directed in a second direction forming an angle strictly lying between 0° and 90° relative to the first direction.

25. The device as claimed in claim 18, wherein the angle is comprised in a range of from 60° to 90°.

* * * * *